US008050114B2

(12) United States Patent  (10) Patent No.: US 8,050,114 B2
Van Winkelhoff et al.  (45) Date of Patent: Nov. 1, 2011

(54) MEMORY DEVICE HAVING A SINGLE PASS-GATE TRANSISTOR PER BITLINE COLUMN MULTIPLEXER COUPLED TO LATCH CIRCUITRY AND METHOD THEREOF

(75) Inventors: Nicolaas Klarinus Johannes Van Winkelhoff, Villard-Bonnot (FR); Bastien Jean Claude Aghetti, Grenoble (FR)

(73) Assignee: ARM Limited, Cambridge (GB)

( * ) Notice: Subject to any disclaimer, the term of this patent is extended or adjusted under 35 U.S.C. 154(b) by 589 days.

(21) Appl. No.: 12/285,797

(22) Filed: Oct. 14, 2008

(65) Prior Publication Data
US 2010/0091581 A1 Apr. 15, 2010

(51) Int. Cl.
*G11C 7/10* (2006.01)
(52) U.S. Cl. ......... 365/189.14; 365/189.15; 365/189.16; 365/190; 365/205; 365/208; 365/203; 365/189.02; 365/189.05; 365/230.03
(58) Field of Classification Search ............ 365/230.03, 365/230.06, 189.02, 189.05, 189.14, 189.15, 365/189.16, 190, 205, 208, 207, 203
See application file for complete search history.

(56) References Cited

U.S. PATENT DOCUMENTS

| | | | |
|---|---|---|---|
| 5,440,506 A * | 8/1995 | Longway et al. | 365/104 |
| 7,099,202 B1 * | 8/2006 | Son et al. | 365/189.05 |
| 7,821,866 B1 * | 10/2010 | Raghavan et al. | 365/230.06 |
| 2010/0091581 A1 * | 4/2010 | Van Winkelhoff et al. | 365/189.05 |

OTHER PUBLICATIONS

Online Publication, Yun, "Memory", *UC San Diego*, May 28, 2008, http://paradise.uscd.edu/class/ece165/notes/IecC.pdf.

* cited by examiner

*Primary Examiner* — Andrew Q Tran
(74) *Attorney, Agent, or Firm* — Nixon & Vanderhye P.C.

(57) ABSTRACT

A memory device, and method of operation of such a device, are provided. The memory device comprises an array of memory cells arranged in a plurality of rows and a plurality of columns, at least one bit line being associated with each column. Column multiplexer circuitry is coupled to the plurality of columns, for inputting write data into a selected column during a write operation and for outputting an indication of read data sensed from a selected column during a read operation. The column multiplexer circuitry comprises a single pass gate transistor per bit line, and latch circuitry is then used to detect the read data from the indication of read data output by the column multiplexer circuitry during the read operation, and to store that detected read data. Such an approach provides a particularly area efficient construction for the column multiplexer circuitry whilst enabling correct evaluation of the read data held in the addressed memory cell.

16 Claims, 8 Drawing Sheets

MEMORY DEVICE HAVING A SINGLE PASS-GATE TRANSISTOR PER BITLINE COLUMN MULTIPLEXER COUPLED TO LATCH CIRCUITRY AND METHOD THEREOF

BACKGROUND OF THE INVENTION

1. Field of the Invention

The present invention relates to a memory device and method of operating such a memory device, and in particular to techniques for reducing the size of the access control circuitry required to read data from, and write data to, the memory device.

2. Description of the Prior Art

A typical memory device will have an array of memory cells arranged in a plurality of rows and a plurality of columns, and access control circuitry will be provided in association with the memory array to enable individual memory cells within the array to be accessed for the purposes of writing data to that memory cell or reading data from that memory cell.

FIG. 1 is a diagram schematically illustrating a typical array of memory cells, and further indicating the access control circuitry provided to access columns within the memory array. In particular, FIG. 1 shows an array of memory cells 10, 20, 30, 40, 50, 60 provided in association with a particular column multiplexer 70 of the memory device. Each row is addressed by a word line 16, 18, and each column has a pair of bit lines 12, 14, 22, 24, 32, 34 associated therewith. From an address provided to the memory device, a row and column within the memory device is identified, with the addressed memory cell being the memory cell at the intersection between the identified row and column. For a read operation, the word line 16, 18 associated with the selected row is selected in order to activate a row of cells, and then the column multiplexer 70 outputs to the IO (Input/Output) control block 80 an indication of the voltages on the pair of bit lines associated with the selected column, this indication identifying the value stored in the addressed memory cell. For a write operation, the word line is activated in the same manner, and the voltage on one of the pair of bit lines associated with the selected column is then discharged to identify the data value to be stored in the addressed memory cell.

As will be appreciated by those skilled in the art, various circuits are provided within the IO control block 80, including the write transistors required to discharge the voltage on one of the pair of bit lines to a logic zero value during a write operation, sense amplifier circuitry for detecting the value stored in the addressed memory cell from the voltage indications output by the column multiplexer 70, etc. It is also known in some implementations to include the sense amplifier circuitry between the bit lines and the column multiplexer, so that the column multiplexer 70 directly samples the output from the relevant sense amplifier.

Typically each memory cell stores a single bit data value, and accordingly if the data being accessed is a multi-bit data word (e.g. 32 bits, 64 bits, etc), it will be necessary to access multiple memory cells. In a typical design, column multiplexers will be provided corresponding to each bit of the data word, each column multiplexer being connected to the bit lines for a plurality of columns containing memory cells in which the associated bit of the data word can be stored. The memory array can hence be considered to be formed of a plurality of sections, one for each column multiplexer. Hence, by way of example a memory array may have 512 word lines, a multiplexer size of four (meaning four columns are connected to each column multiplexer), and a data word size of 32 bits (meaning there are 32 column multiplexers, each column multiplexer being connected to a corresponding section of the memory array). Such a memory can hence store 2048 32-bit data words.

The circuitry provided within the column multiplexers can take a variety of forms. In one known prior art technique, the write and read paths are maintained separately, with separate read pass gates and write pass gates connected to each bit line. Considering the example of FIG. 1 where there are two bit lines per column, this means that there will be four pass gate transistors per column, typically two NMOS transistors and two PMOS transistors. Separate control lines are required for the NMOS and PMOS transistors, and accordingly this will result in four transistors per column and two control lines per column.

Another alternative approach as shown in FIG. 2 is for the read and write paths to be combined, with a transfer gate 72, 74, 76, 78 being associated with each bit line. As shown in FIG. 2, each transfer gate comprises a PMOS transistor and an NMOS transistor coupled back to back, and again separate control signals are required for the PMOS and NMOS transistors. By forming transfer gates in this form, it can be ensured that during a read operation a voltage value at an input to the transfer gate will be propagated on from the output unchanged, irrespective of whether that voltage value represents a logic one level or a logic zero level. If only a single transistor is used on the read path, then for one possible voltage level the voltage level will be propagated on unchanged, whilst for the other possible voltage level the output will be changed due to the threshold voltage of the transistor. For example, if a single NMOS transistor were used as a pass gate for the read path, then a voltage level of zero will be propagated unchanged, but a voltage level of Vdd will be reduced to Vdd-Vth at the NMOS transistor's output, where Vth represents the threshold voltage of the NMOS transistor.

Whilst the transfer gate arrangement shown in FIG. 2 works well, it will be seen that it again requires two transistors per bit line, and accordingly for the arrangement shown in FIG. 1 requires four transistors and two control signals per column.

As also shown schematically in FIG. 2, the outputs from the transfer gates 72, 74, 76, 78 can be provided as pairs of inputs to a sense amplifier circuit 82 in order to detect a read data value during a read operation, whilst for a write operation write driver circuitry 84 can drive inputs to those transfer gates, causing an input at a logic one voltage level to be input to one transfer gate whilst a logic zero voltage level is input to the other transfer gate connected to the other bit line of the selected column.

The presentation entitled "Memory" by K Yun, UC San Diego, appearing on the Internet at the address http://paradise.ucsd.edu/class/ece165/notes/lecC.pdf gives a general overview of the operation of various memory cell designs, and on page 16 illustrates a column multiplexer arrangement in which the read path and write paths are maintained separately, but requiring three transistors per column. However, such an arrangement does not work in modern memories, as sense amplifiers are used to detect the values stored in the memory cells during the read operation, and this would require the addition of an extra read transistor into the design, hence again resulting in the requirement for four transistors per column.

The individual memory cells of the memory array can take a variety of forms. In one particular implementation, the memory cells may be SRAM memory cells, requiring a pair of bit lines to be connected to each memory cell. Such SRAM cells can be arranged in a variety of ways, FIG. 3 illustrating one particular example construction where a 6T SRAM memory cell is used to form each SRAM memory cell of an SRAM memory. As can be seen, the memory cell consists of two PMOS transistors 100, 110 and two NMOS transistors 120, 130. A node 140 is provided between the PMOS transistor 100 and the NMOS transistor 120, and similarly a node 150 is provided between the PMOS transistor 110 and the NMOS transistor 130. The bit line 180 is connected to the node 140 via an access transistor 160, and similarly the bit line 190 is connected to the node 150 via an access transistor 170.

Two different states can be stored within the memory cell shown in FIG. 3, a first state being where the node 140 is at a ground potential and the node 150 is at a power supply potential Vdd, and the second state being a state where the node 140 is at the power supply potential Vdd and the node 150 is at the ground potential.

There is an increasing demand for memory devices to be constructed which are smaller and consume less power than their predecessor designs, whilst retaining high performance. New technologies are being developed which allow a reduction in the size of the individual transistors making up each memory cell, and indeed the transistors making up the associated access control circuitry. However, as the memory cells decrease in size, the variation in behaviour between individual memory cells tends to increase, and this can adversely affect predictability of operation. One particular issue that arises is that as the size of the transistors decrease, they exhibit more leakage current. Hence, considering by way of example the SRAM cell shown in FIG. 3, the access transistors 160, 170 may exhibit more leakage onto the associated bit lines 180, 190. The effect of this is that the leakage will affect the maximum length of bit line which can be supported within the memory device whilst ensuring correct operation.

One way to seek to address this problem is to partition the column up into a plurality of separate sub-columns in the vertical direction, thus creating a plurality of sub-arrays in the bit line direction of the memory device. Each sub-array then needs to be provided with some local access control circuitry to enable data to be read from, and written to, the sub-array, with the various local access control circuits then being connected to a global 10 circuit responsible for outputting data from the memory device and receiving write data to be written into the memory device. Whilst the creation of such sub-arrays within the device reduces the size of the bit lines, and hence improves reliability of operation when using the reduced size transistors available using modern memory technologies, the size of the associated access control circuitry used to read from, and write to, those sub-arrays becomes a significant factor. In particular, each time the bit line length is reduced by a factor of two, the area required for the associated local access control circuitry will increase by a factor of two (assuming the memory device is still to have the same number of memory cells overall), due to the need to duplicate the local access control circuitry.

Accordingly, it would be desirable to develop a technique which enabled the size of the access control circuitry to be reduced, so as to reduce the effect that such access control circuitry has on the area efficiency of the memory device.

SUMMARY OF THE INVENTION

Viewed from a first aspect, the present invention provides a memory device comprising: an array of memory cells arranged in a plurality of rows and a plurality of columns, at least one bit line being associated with each column of said plurality of columns; column multiplexer circuitry coupled to said plurality of columns, for inputting write data into a selected column of said plurality during a write operation and for outputting an indication of read data sensed from a selected column during a read operation; and latch circuitry for detecting the read data from said indication of read data output from the column multiplexer circuitry during the read operation, and for storing said read data; the column multiplexer circuitry comprising a single pass gate transistor per bit line associated with said plurality of columns.

In accordance with the present invention the column multiplexer circuitry coupled to the plurality of columns within an array of memory cells comprises a single pass gate transistor per bit line. During a read operation, the output from such column multiplexer circuitry will provide an indication of read data sensed from a selected column during that read operation, but will not provide an unchanged representation of the input to the column multiplexer circuitry in all instances, due to the earlier-mentioned threshold voltage issue. For example, if the single pass gate transistor is an NMOS transistor, then a voltage level of zero will pass unchanged to the output, but a voltage level of Vdd will result in a reduced voltage at the output, due to the threshold voltage of the NMOS transistor. Thus, the indication of read data output from the column multiplexer circuitry will not in all instances directly provide the read data sensed from the selected column. However, in accordance with the present invention, latch circuitry is provided which is arranged to detect the read data from the indication of the read data output by the column multiplexer circuitry, with that detected read data then being stored in the latch circuitry. In effect, the latch circuitry is constructed so as to be insensitive to any threshold voltage difference which may manifest itself in the output from the column multiplexer circuitry, so as to ensure that the correct read data is latched.

By such an approach, it is possible to significantly reduce the size of the column multiplexer circuitry. For example, considering the earlier-mentioned example where there are a pair of bit lines for each column, then instead of having to provide four transistors (and two associated control signals) per column, the column multiplexer circuitry of the present invention would use two transistors per column, and a single control signal, thus halving the size of the column multiplexer.

The reduction in size of the column multiplexer resulting from the use of the present invention may be useful in any type of memory device where read and write operations are performed in respect of the memory cells. However, the invention is particularly useful in situations where sub-arrays are created within the memory device in order to reduce bit line length, since in such memories the column multiplexers need to be repeated many more times throughout the memory device, and accordingly the savings achieved using the column multiplexers of the present invention are very significant. For example, considering a memory device having a size of one Megabyte, the approach of the present invention may save thousands of transistors and many control lines.

Whilst the pass gate transistors used within the column multiplexer circuitry can take a variety of forms, in one embodiment each pass gate transistor is an NMOS transistor. Typically, such NMOS transistors will already be required to support the write operation, and in accordance with the present invention these NMOS transistors are re-used for the read path. Hence, compared with the transfer gates discussed earlier with reference to FIG. 2, it can be seen that two PMOS transistors per column can be saved (assuming embodiments where there are two bit lines per column), along with one control signal, thereby yielding significant area savings in respect of the column multiplexer circuitry.

In one embodiment, during the read operation or the write operation a selected row from said plurality or rows is enabled to identify an addressed memory cell in said selected column, whereby during the write operation the write data input into the selected column is stored in the addressed memory cell, and during the read operation the indication of read data output from the column multiplexer circuitry indicates the data stored in the addressed memory cell.

Whilst it is possible to provide sense amplifier circuitry at the output of the column multiplexer circuitry, in one embodiment the memory device further comprises sense amplifier circuitry for each column of said plurality of columns, each sense amplifier circuitry being connected to the at least one bit line of the associated column, and during the read operation the sense amplifier circuitry sensing the read data from the associated column and outputting that read data to the column multiplexer circuitry. Hence, in such embodiments, the column multiplexer circuitry receives as its input the output from the sense amplifier circuitry, and generates the indication of the read data from that input.

In such embodiments, the indication of read data output from the column multiplexer circuitry for the selected column differs from the read data sensed by the sense amplifier circuitry associated with the selected column due to a threshold voltage difference across one of the pass gate transistors in the column multiplexer circuitry, and the latch circuitry is constructed to be insensitive to that threshold voltage difference when detecting said read data to be stored.

Some memory cells only require a single bit line to be provided in respect of each column. However, in one embodiment a pair of bit lines are provided for each column. In one such embodiment, prior to the read operation the pair of bit lines are precharged to a first voltage level, and during the read operation the sense amplifier circuitry detects the read data value by detecting a differential in voltage between the pair of bit lines of the associated column, and drives the voltage on one of the bit lines in the pair to a second voltage level dependent on the detection. Accordingly, in such embodiments, it will be seen that for the selected column the column multiplexer will receive as its input the first voltage level (e.g. Vdd) on one of the bit lines and the second voltage level (e.g. a voltage level of zero) on the other bit line.

In one embodiment, during the read operation the column multiplexer circuitry enables a pair of pass gate transistors coupled to the pair of bit lines of the selected column, the output from the pair of pass gate transistors providing the indication of read data output from the column multiplexer circuitry, and said indication differing from the read data sensed by-the sense amplifier circuitry associated with the selected column due to a threshold voltage difference across one of the pass gate transistors in said pair.

In particular, in one embodiment, the indication of read data output from the column multiplexer circuitry comprises first and second voltage signals, the value of one of said voltage signals being affected by said threshold voltage difference, and said latch circuitry is arranged to detect the read data from said indication of read data by ensuring that the read data stored in the latch circuitry is determined by the voltage signal that has not been affected by the threshold voltage difference.

Hence, considering the earlier-mentioned example where each pass gate transistor in the column multiplexer circuitry is an NMOS transistor, the latch circuitry can be arranged to use whichever of the first and second voltage signals is at the logic zero voltage level to dictate the read data stored in the latch circuitry.

In one particular embodiment, the latch circuitry comprises a pair of PMOS transistors coupled in parallel between a reference voltage and a storage element, the first and second voltage signals output from the column multiplexer circuitry being provided to respective gates of the pair of PMOS transistors. Hence, whichever of the first and second voltage signals is at the zero voltage level will turn on its associated PMOS transistor, whilst the other PMOS transistor will remain turned off.

The voltage signal at the non-zero voltage level should not reduce to a level where it will also turn on its associated PMOS transistor since the threshold voltage drop should not be sufficient to lower the voltage of that voltage signal to a level where the PMOS transistor would turn on. However, to remove the possibility of that occurring, in one embodiment, prior to the read operation, the gates of the pair of PMOS transistors are precharged to a first voltage level, in one embodiment the first voltage level being Vdd.

Considering embodiments where each column has a pair of bit lines associated therewith, then in one particular embodiment the sense amplifier circuitry includes a pair of cross-connected transistors, typically PMOS transistors. Whilst the sense amplifier circuitry is only actively used for read operations, a side effect of this construction is that during a write operation the pair of cross-connected transistors serves to avoid one of the bit lines in the pair floating during programming of an addressed memory cell. In particular, if a logic zero voltage level is present on one of the bit lines during the write operation, it will ensure that the voltage level on the other bit line is at a logic one (i.e. Vdd) level. Hence, the presence of the sense amplifier circuitry between the bit lines and the column multiplexer ensures that there is no need to provide a separate pair of cross-connected transistors to remove the possibility of one of the bit lines floating during the write operation.

As mentioned earlier, whilst the memory device of embodiments of the present invention is applicable to any memory device design where the individual memory cells can be both written to or read from, such a construction of memory device is particularly beneficial when partitioning the memory device into a plurality of sub-arrays in order to reduce the bit line length for any particular grouping of memory cells. In such embodiments, the above described memory device can be considered to form a sub-array and associated access control circuitry for that sub-array. Accordingly, a global memory device can be provided comprising a plurality of such memory devices, with global input/output circuitry then being provided within the global memory device, such that during a read operation the global input/output circuitry receives as inputs the read data stored in at least one latch circuitry.

Expressed another way, viewed from a second aspect, the present invention provides a memory device, comprising: a plurality of sub-arrays, each sub-array comprising a plurality of memory cells arranged in a plurality of rows and a plurality of columns, at least one bit line being associated with each column of said plurality of columns; sub-array input/output circuitry associated with each sub-array, each sub-array input/output circuitry comprising column multiplexer circuitry coupled to said plurality of columns of the associated sub-array, for inputting write data into a selected column of said plurality during a write operation and for outputting an indication of read data sensed from a selected column during a read operation, the column multiplexer circuitry comprising a single pass gate transistor per bit line associated with said plurality of columns; and latch circuitry for detecting the read data from said indication of read data output from the column multiplexer circuitry during the read operation, and for storing said read data for subsequent reading by global input/output circuitry.

In one embodiment, the latch circuitry could be provided in association with the global input/output circuitry. However, the operation of such latch circuitry is likely to be slow. Accordingly, in one embodiment, separate latch circuitry is provided in each sub-array input/output circuitry.

Viewed from a third aspect, the present invention provides a method of operating a memory device comprising an array of memory cells arranged in a plurality of rows and a plurality of columns, at least one bit line being associated with each column of said plurality of columns, the method comprising the steps of: employing column multiplexer circuitry coupled to said plurality of columns to input write data into a selected column of said plurality during a write operation, and to output an indication of read data sensed from a selected column during a read operation, the column multiplexer circuitry having a single pass gate transistor per bit line associated with said plurality of columns; and during a read operation employing latch circuitry to detect the read data from said indication of read data output from the column multiplexer circuitry during the read operation, and to store said read data.

Viewed from a fourth aspect, the present invention provides a memory device comprising: an array of memory cell means arranged in a plurality of rows and a plurality of columns, at least one bit line means being associated with each column of said plurality of columns; column multiplexer means, coupled to said plurality of columns, for inputting write data into a selected column of said plurality during a write operation and for outputting an indication of read data sensed from a selected column during a read operation; and latch means for detecting the read data from said indication of read data output from the column multiplexer means during the read operation, and for storing said read data; the column multiplexer means comprising a single pass gate transistor means per bit line means associated with said plurality of columns.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 4:
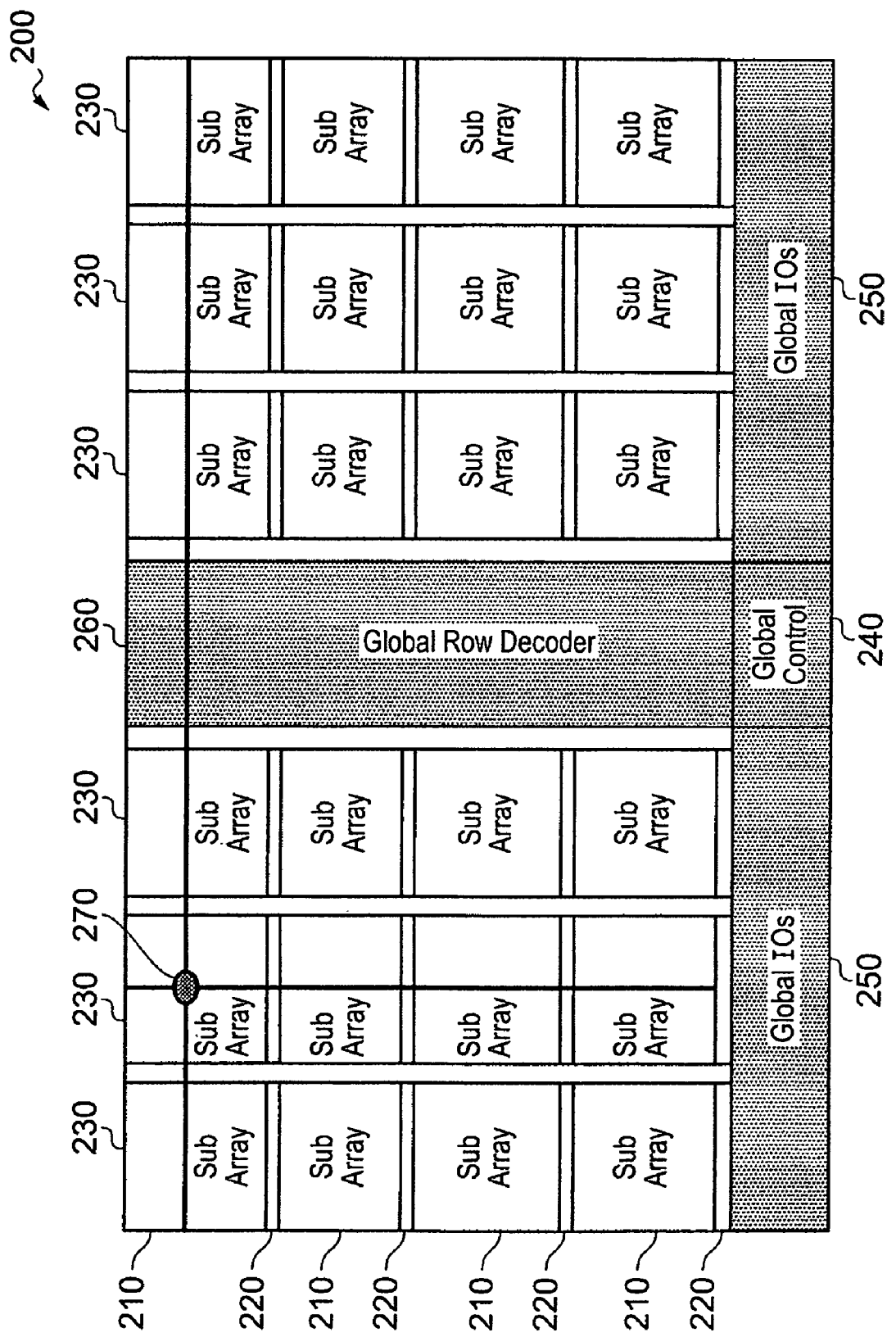
FIG. 4 schematically illustrates the arrangement of a memory device comprising a plurality of sub-arrays, where each sub-array and associated local IO circuitry may be constructed using the techniques of embodiments of the present invention.

FIG. 4 illustrates a memory device 200 where the memory array is divided up into a plurality of sub-arrays and associated local IO circuitry. Each sub-array and associated local IO circuitry may be constructed using the techniques of embodiments of the present invention. As shown in FIG. 4, a plurality of sub-array columns 230 are provided. Whilst in this illustrative embodiment six sub-array columns are shown, it will be appreciated that in a typical memory device there may be significantly more sub-array columns provided. Each sub-array column 230 is divided up into a plurality of sub-arrays 210, each sub-array 210 having associated local IO circuitry 220. In the illustrative example shown in FIG. 4, each sub-array column is divided up into four sub-arrays 210 and associated local IO circuits 220, but it will be appreciated that in a typical memory device there may be significantly more than four sub-array structures provided within each sub-array column 230.

By dividing each sub-array column 230 into a plurality of sub-arrays, the length of the bit lines provided within the memory device can be significantly reduced, when compared with a memory device where each column includes only a single memory array. This is particularly beneficial when using modern memory technologies such as 45 nm technology, where the individual transistors are very small, and access transfer current leakage is hence an issue. By keeping the bit line length relatively short, it can be ensured that such current leakage does not affect the correct operation of the memory device.

The memory device 200 has a global control block 240 which is used to control the operation of the global row decoder 260 and the global IO circuits 250. For a specified memory address, the global row decoder will be arranged to identify a word line within the memory device containing the addressed memory cell, and to issue an enable signal to that word line, enabling the addressed memory cell to be read from for a read operation, or to be written to for a write operation. Meanwhile, the global IO circuitry can identify based on the address the relevant column containing the addressed memory cell, and hence issue control signals to the required local IO circuitry to cause a read data value to be sensed and output to the global IO circuitry in the event of a read operation, or to cause write data to be input into the relevant column during a write operation. Hence, via the global row decoder 260, the global IO circuitry 250 and the relevant local IO circuitry 220, an addressed memory cell 270 can be accessed.

Figure 5:
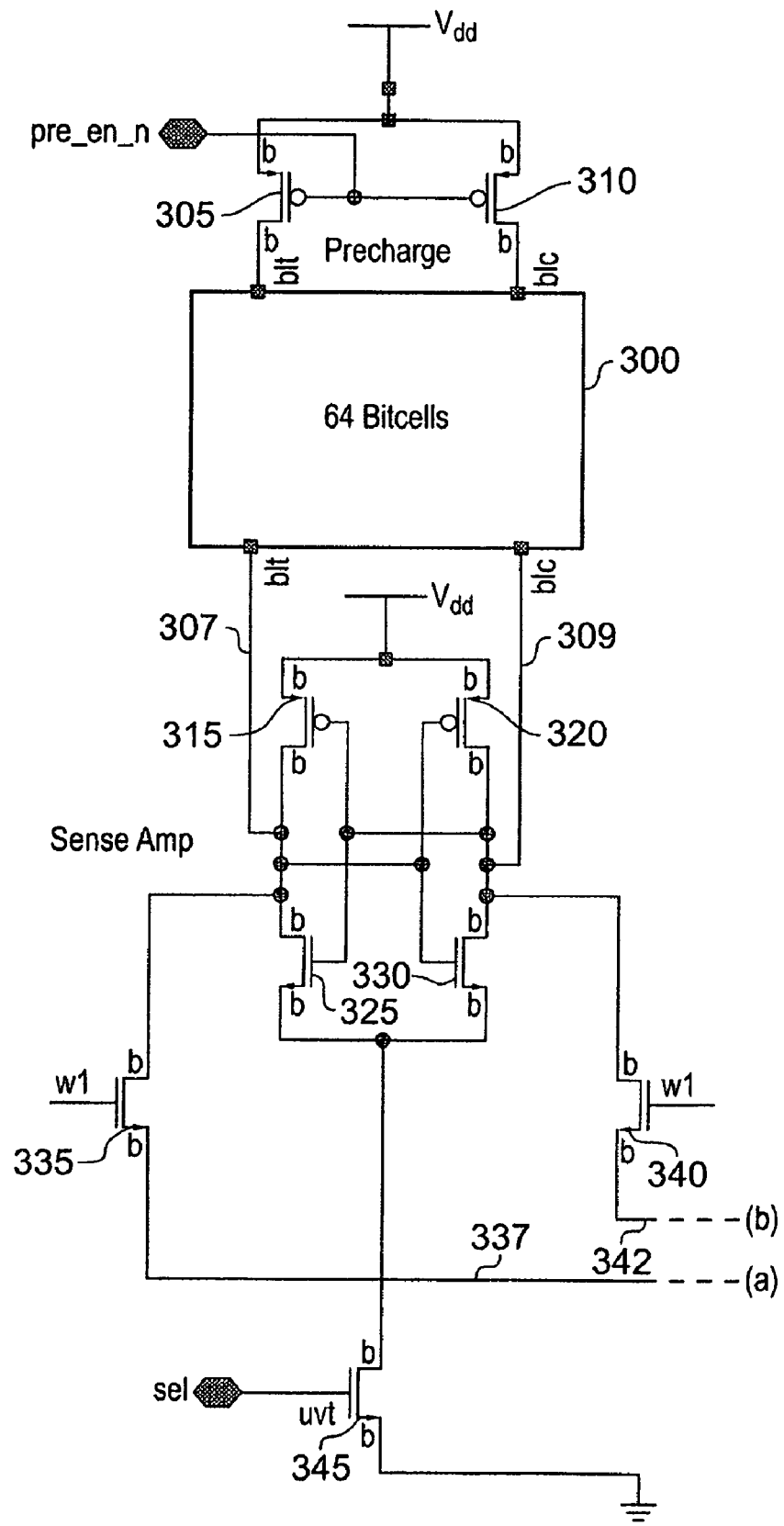
FIG. 5 illustrates local IO circuitry associated with each column of memory cells within a sub-array in accordance with one embodiment of the present invention.

FIG. 5 illustrates a column of memory cells that may be found within a particular sub-array, along with the associated local IO circuitry provided in association with that column. In the particular example shown in FIG. 5 each column in the sub-array consists of a column of 64 memory cells 300. The memory cells may take a variety of forms, but in one embodiment can be formed as 6T SRAM cells such as those referred to earlier with reference to FIG. 3. A pair of bit lines 307, 309 run through the column of memory cells 300, and are precharged to the Vdd voltage level via the PMOS transistors 305, 310. In particular, when a precharge enable signal is set high, the pre_en_n signal will be at a logic zero value, turning on the PMOS transistors 305, 310 so as to pull the bit lines up to the voltage level Vdd.

The two PMOS transistors 315, 320 and the two NMOS transistors 325, 330 collectively form sense amplifier circuitry connected across the bit lines 307, 309. During a read operation, the precharge enable signal will be turned off, causing the transistors 305, 310 to turn off, and then the relevant word line will be enabled to cause one of the memory cells within the column 300 to be activated. As a result, the voltage on one of the bit lines 307, 309 will start to discharge, which bit line discharges being dependent on the data value stored in that memory cell. After some predetermined time sufficient to enable the difference between the voltages on the two bit lines 307, 309 to reach a level which the sense amplifier can detect, the sense amplifier will be turned on by issuing a select signal to the NMOS transistor 345, thereby turning that transistor on. At this point, the sense amplifier will quickly pull down to a zero voltage level the voltage on the bit line that has started to discharge. In particular, whichever of the NMOS transistors 325, 330 is driven by the higher voltage will rapidly pull its output to a logic zero level. Such a sense amplifier circuit is often referred to as a latching sense amplifier, since once one of the NMOS transistors 325, 330 starts to conduct more strongly than the other, the voltage on one of the bit lines will be pulled down to a logic zero level very quickly, and the process is not reversible at that point.

Shortly after the sense amplifier is enabled, then if the column of memory cells 300 contains the addressed memory cell, the two NMOS transistors 335, 340 (which can be considered to be part of the column multiplexer circuitry within the local IO circuitry) are turned on causing the output from the sense amplifier to be output over lines 337, 342. It will be appreciated that at this point one of the output signals on lines 337, 342 will be at a zero voltage level, whilst the other output signal will be approximately at the voltage level Vdd. However, since only a single NMOS transistor is provided within the column multiplexer for each bit line, these pass gate transistors 335, 340 will not pass the voltage level Vdd unchanged. In particular, the output from the pass gate transistor 335, 340 that receives Vdd at its input will have a slightly reduced voltage, equivalent to Vdd-Vth. Hence, considering the example situation where a zero voltage level is considered to represent a logic zero value, and a Vdd voltage level is considered to represent a logic one value, it will be seen that one of the output signals 337, 342 will represent the logic zero value, whilst the other of the output signals will have a voltage slightly less than that representing the logic one value.

Figure 6:
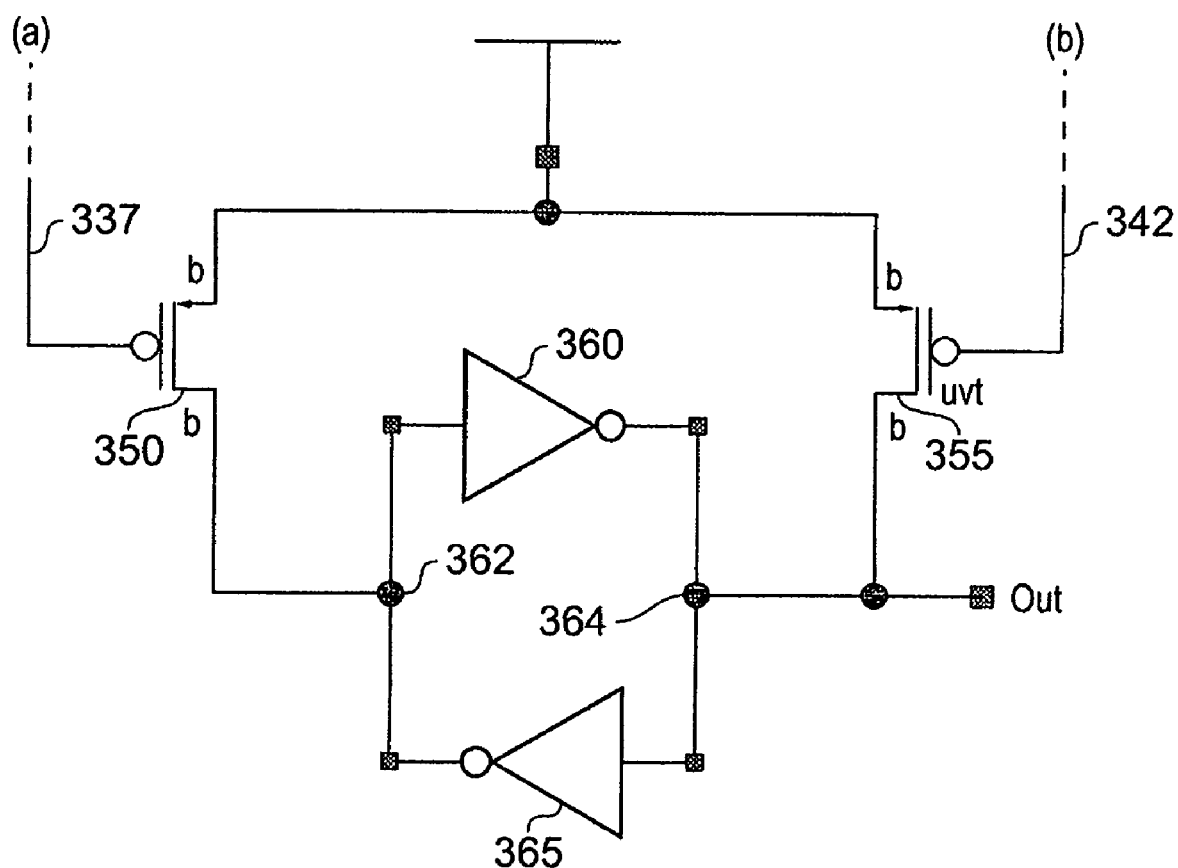
FIG. 6 illustrates latch circuitry which in one embodiment is provided within each local IO circuitry, and is shared amongst the columns of the associated sub-array.

Those output signals are routed to latch circuitry, which in one embodiment can take the form shown in FIG. 6. The latch circuitry in FIG. 6 is shared between all of the columns in the sub-array, since only one of those columns will contain the addressed memory cell, and accordingly for only one of those columns will the NMOS transistors 335, 340 be turned on for any particular read operation.

At the input to the latch circuitry of FIG. 6, two PMOS transistors 350, 355 are provided. Whichever of those two PMOS transistors receives the zero voltage input will turn on, hence causing the correct read data value to be stored within the storage element of the latch formed by the two inverters 360, 365. In particular, it will be appreciated that if the input to the PMOS transistor 350 is at a zero voltage level, a logic one value will be stored at the node 362 and a logic zero value will be stored at the node 364. Conversely, if the zero voltage input is received at the PMOS transistor 355, the node 362 will be at a logic zero value and the node 364 will be at a logic one value.

As mentioned earlier, the voltage received at the other input to the latch will be at the voltage Vdd-Vth, and this will be a sufficiently high voltage to avoid the PMOS transistor 350, 355 receiving that voltage from turning on. However, to ensure that that voltage level cannot decay further over time, in one embodiment the output lines 337, 342 are precharged to the voltage level Vdd prior to the read operation being initiated.

Accordingly, it will be appreciated from the above description of FIGS. 5 and 6 that even though the column multiplexer circuitry only includes a single NMOS transistor per bit line, and accordingly the column multiplexer only provides pass gates rather than true transfer gates (resulting in the output from the column multiplexer being modified slightly with respect to the output of the sense amplifier), the latch circuitry in FIG. 6 is constructed to be insensitive to that change so as to ensure that the correct read data value is stored within the latch. In particular, the latch circuitry ensures that the read data stored within it is determined by the voltage signal that has not been affected by the threshold voltage difference across one of the pass gate transistors 335, 340. This enables a very significant reduction in the size of the column multiplexer circuitry required within each local 10 circuit. As will be appreciated from the earlier discussion of FIG. 4, the local IO circuitry has to be replicated many times across the memory device 200, and accordingly this results in very significant space saving across the memory device as a whole.

Figure 7:
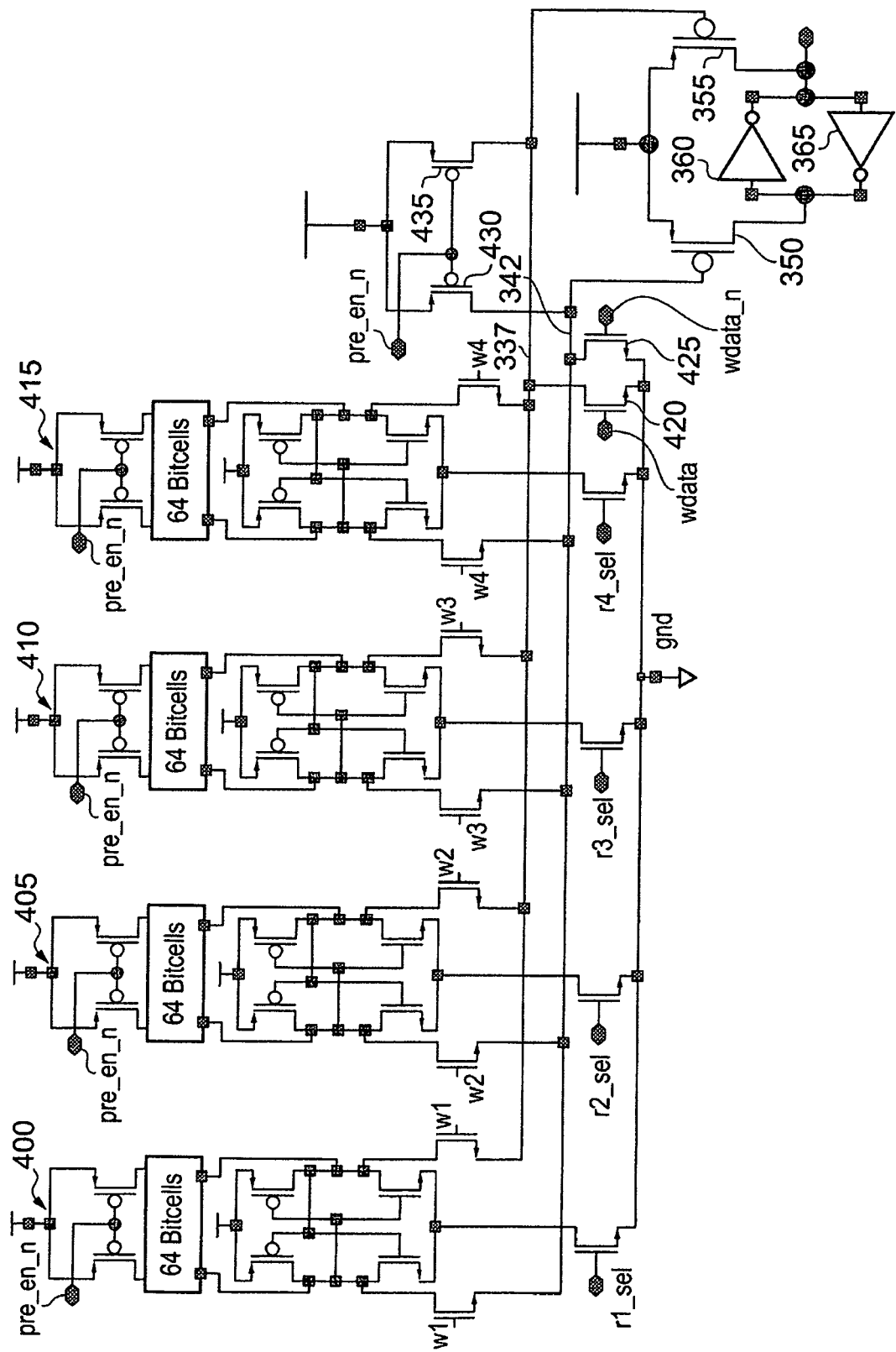
FIG. 7 schematically illustrates a sub-array and associated local IO circuitry in accordance with one embodiment of the present invention.

FIG. 7 illustrates an example sub-array and associated local IO circuitry, for an example embodiment where the sub-array includes four columns of bit cells. Accordingly, it can be seen that the circuitry of FIG. 5 is repeated four times, referred to in FIG. 7 by the reference numerals 400, 405, 410, 415. The latch circuitry of FIG. 6 is shown in the bottom right hard corner of FIG. 7, and is shared amongst the four columns. As discussed earlier, during any read operation, only one of the columns will be selected by the NMOS pass gate transistors 335, 340 of that column, and accordingly only one of the columns will generate an output for storing in the latch circuitry.

Also shown in FIG. 7 is the precharge circuitry 430, 435, this operating in exactly the same way as the precharge circuitry 305, 310 shown in FIG. 5 for each column, and serving to pull the output lines 337, 342 up to the voltage level Vdd prior to any read or write operation.

Also shown in FIG. 7 is write driver circuitry taking the form of two NMOS transistors 420, 425. During the write operation, the NMOS transistor 420 is driven by the data value to be stored, whilst the NMOS transistor 425 is driven by the inverse of the data value. Accordingly, it will be appreciated that one of the NMOS transistors 420, 425 will turn on, pulling the relevant line 337 or 342 down to a logic zero level. When the pass gate transistors 335, 340 for the addressed column are then enabled, this logic zero value will pass to the relevant bit line causing the required data value to be stored in the addressed memory cell. Whilst the sense amplifier circuitry is not employed for a write operation, the two PMOS transistors 315, 320 ensure that the bit line that has not been driven down to a logic zero level is not left at any indeterminate floating voltage, but instead is driven up to Vdd, thereby ensuring reliability in the storage of the required data value within the addressed memory cell. Hence, by way of illustration, if the write driver circuitry causes the voltage on line 337 to be pulled down to a logic zero level, this will cause the bit line 307 to be pulled to a logic zero level. The PMOS transistor 320 will accordingly turn on, ensuring that the bit line 309 is pulled up to the voltage level Vdd.

Figure 8:
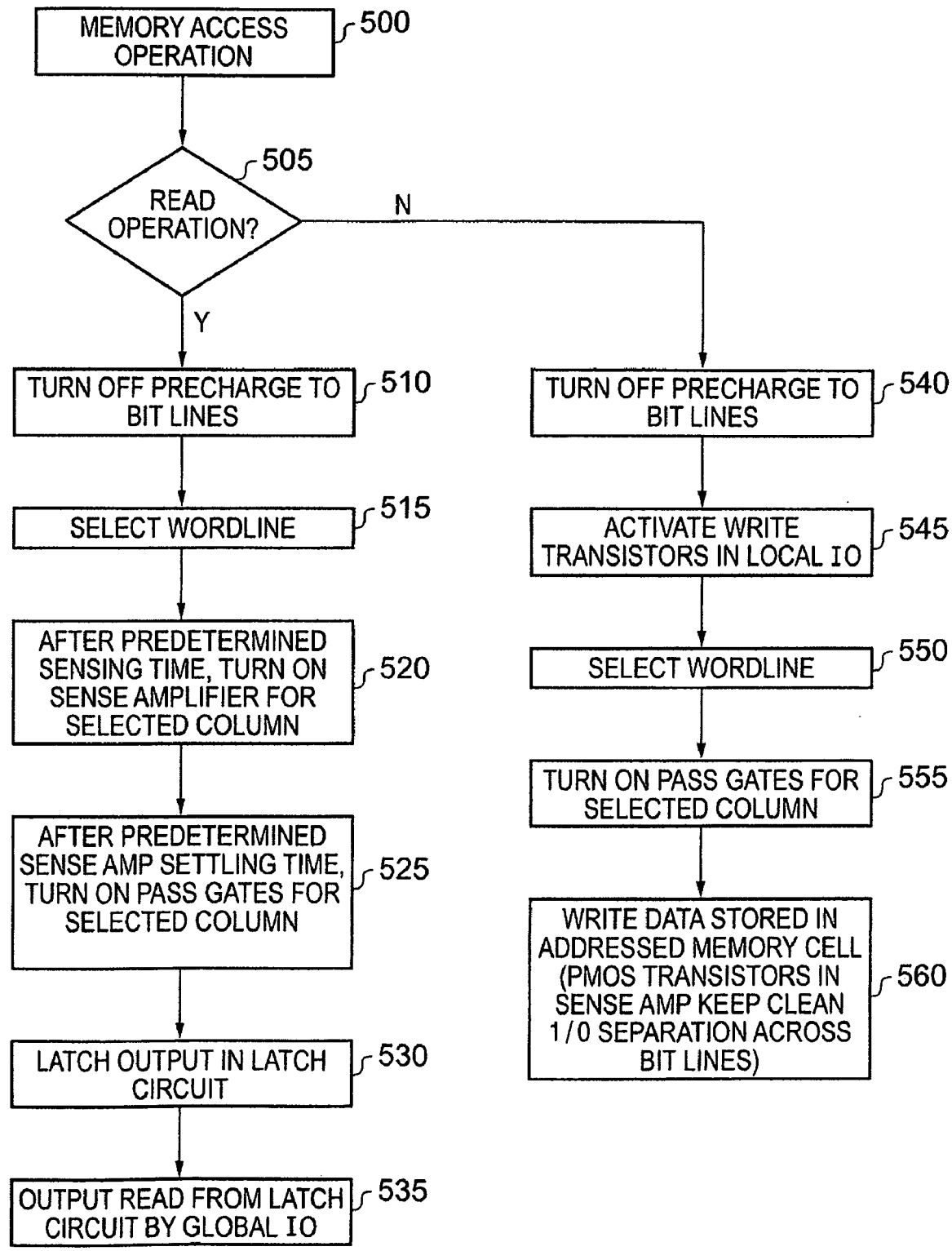
FIG. 8 is a flow diagram illustrating the steps performed during read or write operations in accordance with one embodiment of the present invention.

FIG. 8 is a flow diagram illustrating the steps performed during a read or a write operation in accordance with one embodiment of the present invention. At step 500, a memory access operation is initiated, whereafter at step 505 it is determined whether the operation is a read operation or a write operation. Assuming the operation is a read operation, then the process proceeds to step 510, where the precharging of the bit lines is disabled. In particular, at this point the transistors 305, 310 in each column will be turned off. Further, it should be noted that the transistors 430, 435 shown in FIG. 7 will also be turned off at this time.

At step 515, the word line containing the addressed memory cell will then be enabled. It should be noted that whilst steps 510 and 515 are shown sequentially, the order of these steps can be reversed, or indeed they can be performed in parallel.

After a predetermined sensing time sufficient to allow the voltage on one of the bit lines to discharge to a level where it can be sensed by the sense amplifier, the sense amplifier circuitry is then turned on at step 520 by issuing the select signal to the NMOS transistor 345 in the column containing the addressed memory cell.

Thereafter, after some predetermined sense amp settling time (which will typically be a very short time given the speed of operation of the sense amplifier shown in FIG. 5), the pass gate transistors 335, 340 will be turned on at step 525 for the column containing the addressed memory cell, causing output signals to be issued over paths 337, 342. By waiting for the predetermined sense amp settling time to elapse before turning on the pass gates, the capacitance associated with the latch circuitry of FIG. 6 is prevented from affecting the operation of the sense amplifier circuitry, and allows the sense amplifier circuitry to operate more quickly. At step 530, the output signals on paths 337, 342 are used to cause the read data value sensed by the sense amplifier to be stored in the latch circuitry of FIG. 6. Thereafter, at step 535, that read data value can be output from the latch circuit to the global IO circuitry 250 shown in FIG. 4.

If at step 505, it is determined that the memory access operation is a write operation, then the process proceeds to step 540, where the precharge transistors are disabled. Step 540 is equivalent to the step 510 performed for a read operation. At step 545, the write transistors are activated in the local IO circuitry, based on control signals issued from the global IO circuitry 250. Hence, based on the addressed memory cell, the global IO circuitry 250 will identify the column containing the addressed memory cell, and will issue a control signal to the local IO circuitry associated with a sub-array containing the addressed memory cell to cause the write driver transistors 420, 425 to be activated. The data value to be written into the addressed memory cell will be provided as one of the control signals from the global IO circuitry 250, and will determine which of the write transistors 420, 425 is turned on. Whilst step 545 is shown as following step 540, the actual timing of step 545 is not critical.

At step 550, the word line containing the addressed memory cell is enabled, whereafter at step 555 the pass gate transistors 335, 340 for the selected column are then turned on. As a result, the output from the write driver transistors 420, 425 will be passed onto the bit lines for the selected column, causing the required data value to be stored within the addressed memory cell at step 560. As mentioned earlier, the PMOS transistors 315, 320 in the sense amplifier will ensure a clean logic one/logic zero separation between the signals on the two bit lines, thereby ensuring correct operation of the addressed memory cell.

From the above description of embodiments of the present invention, it will be appreciated that the techniques discussed allow a significant simplification in the column multiplexer circuitry provided, typically saving two transistors and a control line per column of memory cells. Such an approach is particularly beneficial when employed within a memory array such as that shown in FIG. 4, where a plurality of sub-arrays are provided in order to shorten the length of bit lines, since in such memory devices the column multiplexer circuitry is required within each local IO circuitry, and hence needs to be repeated many times. Nevertheless, the techniques of embodiments of the present invention are not restricted to such designs, and would also result in space savings in memory devices where long bit lines are used running through the entire length of the memory array.

Considering embodiments such as those shown in FIG. 4, the use of short bit lines increases the stability of the memory cells, and improves operational speed whilst also reducing power consumption. In particular, a short bit line has less capacitance than a large bit line, and accordingly its voltage will descend more quickly, and a possibly unstable cell will hence be less likely to lose its information. Hence, the use of such a short bit line results in improved static noise margin (SNM). Further, a short bit line will never consume more power than the total required to discharge it to the logic zero level, and since the capacity of a short bit line is significantly less than that of a long bit line, the power consumption is clearly less than would be the case for a long bit line. A further benefit of using short bit lines is that less RC delay is incurred in short bit lines than in long bit lines. By adopting the techniques of embodiments of the present invention, the use of such short bit lines becomes more practical, since the overhead of providing local IO circuitry in association with each sub-array is significantly reduced. In particular, by using such techniques to reduce the size of the column multiplexer circuitry required within each local IO circuitry, the area taken up by such local IO circuitry can be significantly reduced, thereby alleviating any adverse effect on area efficiency resulting from the need to replicate local IO circuitry within the memory device.

Figure 1:
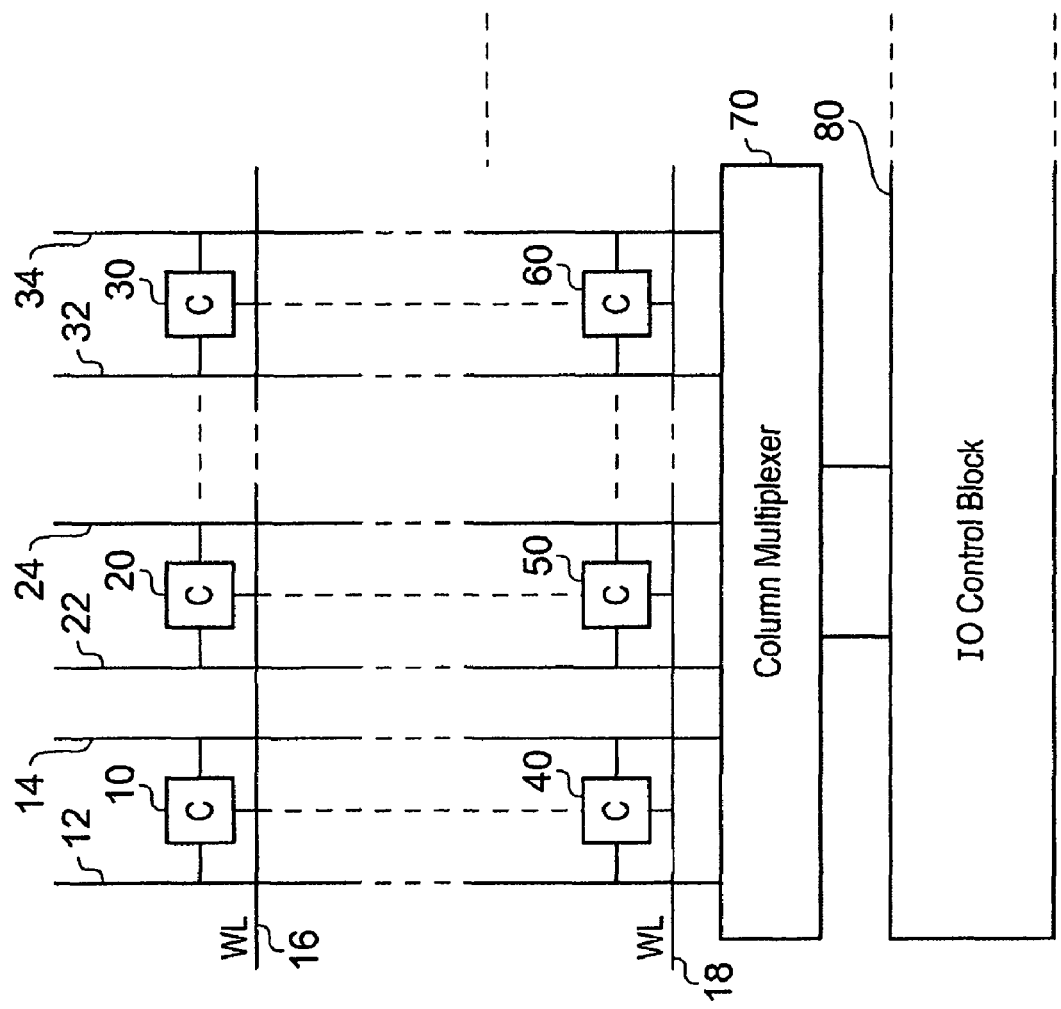
FIG. 1 is a block diagram schematically illustrating a known memory device.
Figure 2:
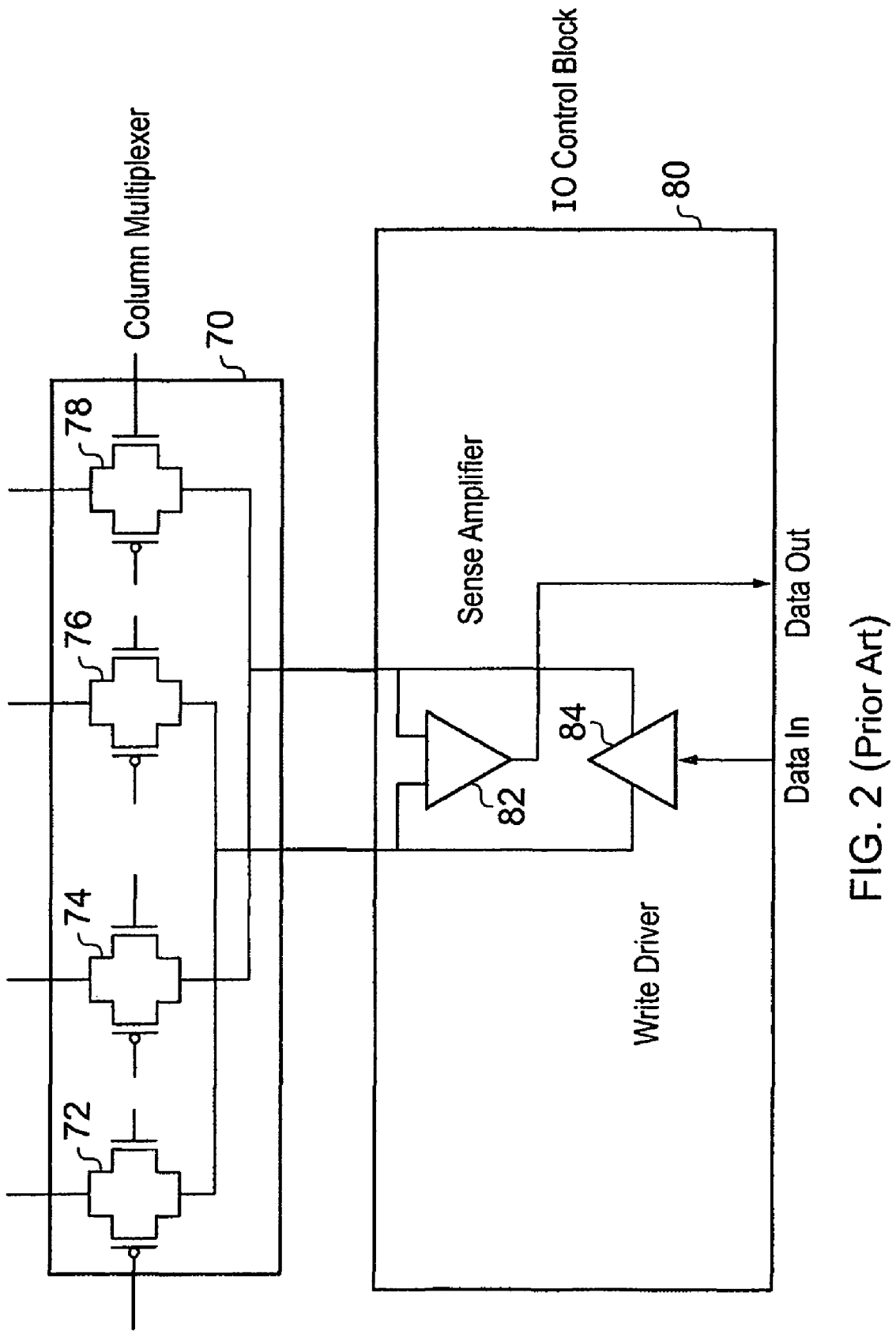
FIG. 2 illustrates in more detail components provided within the column multiplexer and input/output (IO) control block of FIG. 1.
Figure 3:
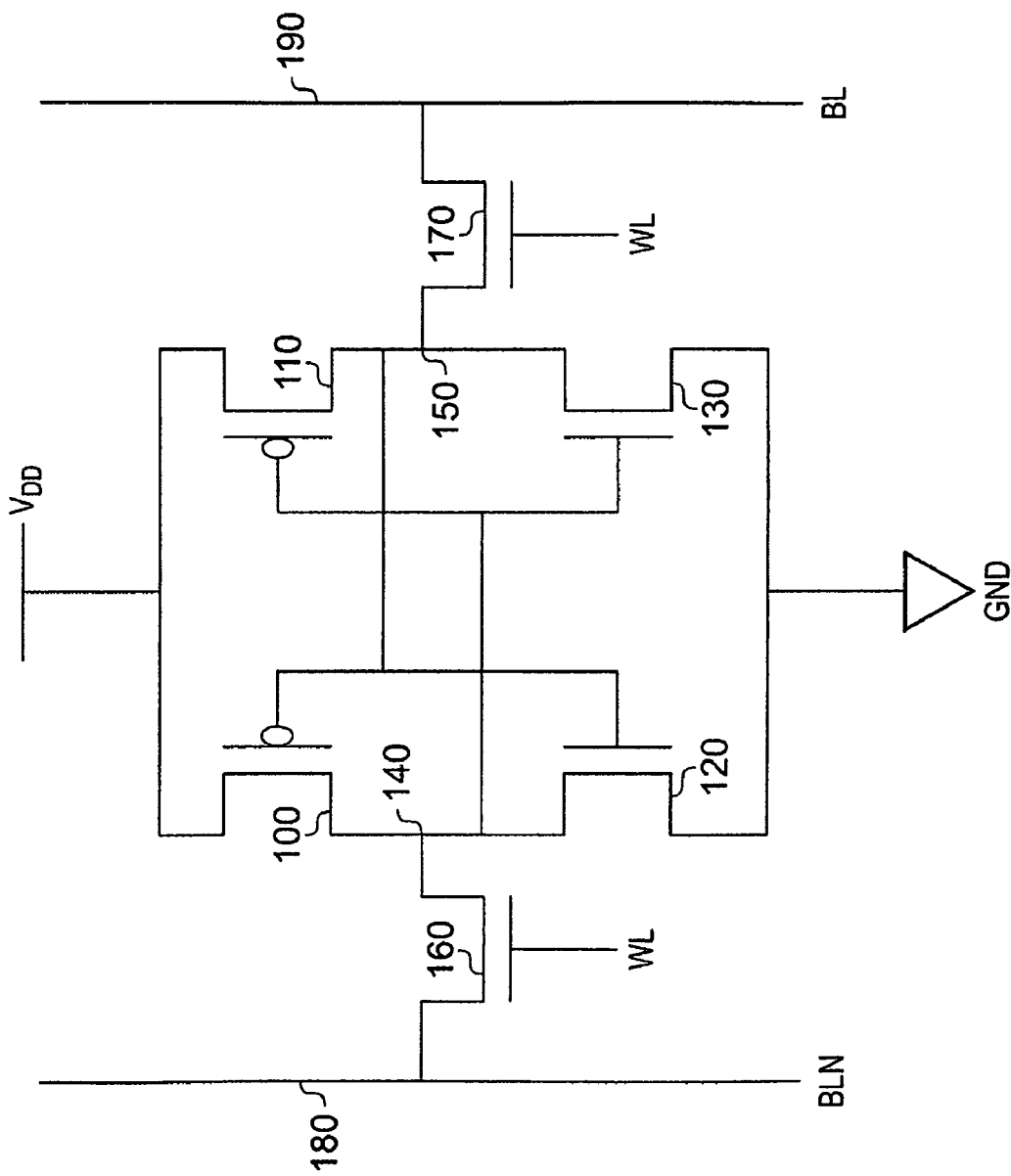
FIG. 3 illustrates the arrangement of a 6T SRAM memory cell that may be used to form the individual memory cells within the memory array of a memory device.

The technique of embodiments of the present invention is generally applicable across a variety of technologies, and for various different kinds of memory cells. For example, the invention can be used irrespective of whether the individual memory cells are constructed using bulk CMOS (Complementary Metal Oxide Semiconductor) technology or are alternatively constructed using SOI (Silicon-On-Insulator) technology. Further, techniques of embodiments of the present invention are not only restricted to memory devices using memory cells arranged as six transistor cells as shown in FIG. 3, but can be applied to memory devices using various other types of memory cells subjected to both read and write operations.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:
1. A memory device comprising:
an array of memory cells arranged in a plurality of rows and a plurality of columns, at least one bit line being associated with each column of said plurality of columns;
column multiplexer circuitry coupled to said plurality of columns, for inputting write data into a selected column of said plurality during a write operation and for outputting an indication of read data sensed from a selected column during a read operation; and
latch circuitry for detecting the read data from said indication of read data output from the column multiplexer circuitry during the read operation, and for storing said read data;
the column multiplexer circuitry comprising a single pass gate transistor per bit line associated with said plurality of columns.

2. A memory device as claimed in claim 1, wherein during said read operation or said write operation a selected row from said plurality of rows is enabled to identify an addressed memory cell in said selected column, whereby during the write operation the write data input into the selected column is stored in the addressed memory cell, and during the read operation the indication of read data output from the column multiplexer circuitry indicates the data stored in the addressed memory cell.

3. A memory device as claimed in claim 1, further comprising sense amplifier circuitry for each column of said plurality of columns, each sense amplifier circuitry being connected to the at least one bit line of the associated column, and during the read operation the sense amplifier circuitry sensing the read data from the associated column and outputting that read data to the column multiplexer circuitry.

4. A memory device as claimed in claim 3, wherein the indication of read data output from the column multiplexer circuitry for the selected column differs from the read data sensed by the sense amplifier circuitry associated with the selected column due to a threshold voltage difference across one of the pass gate transistors in the column multiplexer circuitry, and the latch circuitry is constructed to be insensitive to that threshold voltage difference when detecting said read data to be stored.

5. A memory device as claimed in claim 3, wherein:
for each column said associated at least one bit line comprises a pair of bit lines;
prior to the read operation the pair of bit lines are pre-charged to a first voltage level;
during the read operation the sense amplifier circuitry detects the read data value by detecting a differential in voltage between the pair of bit lines of the associated column, and drives the voltage on one of the bit lines in the pair to a second voltage level dependent on the detection.

6. A memory device as claimed in claim 5, wherein during the read operation the column multiplexer circuitry enables a pair of pass gate transistors coupled to the pair of bit lines of the selected column, the output from the pair of pass gate transistors providing the indication of read data output from the column multiplexer circuitry, and said indication differing from the read data sensed by the sense amplifier circuitry associated with the selected column due to a threshold voltage difference across one of the pass gate transistors in said pair.

7. A memory device as claimed in claim 6, wherein:
the indication of read data output from the column multiplexer circuitry comprises first and second voltage signals, the value of one of said voltage signals being affected by said threshold voltage difference; and
said latch circuitry is arranged to detect the read data from said indication of read data by ensuring that the read data stored in the latch circuitry is determined by the voltage signal that has not been affected by the threshold voltage difference.

8. A memory device as claimed in claim 7, wherein:
each pass gate transistor in the column multiplexer circuitry is an NMOS transistor; and
the latch circuitry comprises a pair of PMOS transistors coupled in parallel between a reference voltage and a storage element, the first and second voltage signals output from the column multiplexer circuitry being provided to respective gates of the pair of PMOS transistors.

9. A memory device as claimed in claim 8, wherein prior to the read operation, the gates of the pair of PMOS transistors are precharged to the first voltage level.

10. A memory device as claimed in claim 3, wherein:
for each column said associated at least one bit line comprises a pair of bit lines; and
each sense amplifier circuitry includes a pair of cross-connected transistors, during the write operation the pair of cross-connected transistors serving to avoid one of the bit lines in said pair floating during programming of an addressed memory cell.

11. A memory device as claimed in claim 1, wherein each pass gate transistor in the column multiplexer circuitry is an NMOS transistor.

12. A global memory device comprising:
a plurality of memory devices as claimed in claim 1; and
global input/output circuitry, during the read operation the global input/output circuitry receiving as inputs the read data stored in at least one latch circuitry.

13. A memory device, comprising:
a plurality of sub-arrays, each sub-array comprising a plurality of memory cells arranged in a plurality of rows and a plurality of columns, at least one bit line being associated with each column of said plurality of columns;
sub-array input/output circuitry associated with each sub-array, each sub-array input/output circuitry comprising column multiplexer circuitry coupled to said plurality of columns of the associated sub-array, for inputting write data into a selected column of said plurality during a write operation and for outputting an indication of read data sensed from a selected column during a read operation, the column multiplexer circuitry comprising a single pass gate transistor per bit line associated with said plurality of columns; and
latch circuitry for detecting the read data from said indication of read data output from the column multiplexer circuitry during the read operation, and for storing said read data for subsequent reading by global input/output circuitry.

14. A memory device as claimed in claim 13, wherein separate latch circuitry is provided in each sub-array input/output circuitry.

15. A method of operating a memory device comprising an array of memory cells arranged in a plurality of rows and a plurality of columns, at least one bit line being associated with each column of said plurality of columns, the method comprising the steps of:
employing column multiplexer circuitry coupled to said plurality of columns to input write data into a selected column of said plurality during a write operation, and to output an indication of read data sensed from a selected column during a read operation, the column multiplexer circuitry having a single pass gate transistor per bit line associated with said plurality of columns; and during the read operation employing latch circuitry to detect the read data from said indication of read data output from the column multiplexer circuitry during the read operation, and to store said read data.

16. A memory device comprising:

an array of memory cell means arranged in a plurality of rows and a plurality of columns, at least one bit line means being associated with each column of said plurality of columns;

column multiplexer means, coupled to said plurality of columns, for inputting write data into a selected column of said plurality during a write operation and for outputting an indication of read data sensed from a selected column during a read operation; and latch means for detecting the read data from said indication of read data output from the column multiplexer means during the read operation, and for storing said read data;

the column multiplexer means comprising a single pass gate transistor means per bit line means associated with said plurality of columns.

\* \* \* \* \*